US007928766B2

(12) United States Patent
Welty

(10) Patent No.: US 7,928,766 B2
(45) Date of Patent: Apr. 19, 2011

(54) SEMI-BUFFERED AUTO-DIRECTION-SENSING VOLTAGE TRANSLATOR

(75) Inventor: Mark Benjamin Welty, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/901,054

(22) Filed: Sep. 14, 2007

(65) Prior Publication Data

US 2008/0164932 A1 Jul. 10, 2008

Related U.S. Application Data

(60) Provisional application No. 60/884,278, filed on Jan. 10, 2007.

(51) Int. Cl.
*H03K 19/094* (2006.01)

(52) U.S. Cl. ............... 326/68; 326/83; 326/81; 327/333

(58) Field of Classification Search .............. 326/62–63, 326/68, 81–83, 86–87, 112, 115, 127; 327/108–109, 327/333

See application file for complete search history.

(56) References Cited

U.S. PATENT DOCUMENTS

| | | | | |
|---|---|---|---|---|
| 6,034,553 | A * | 3/2000 | Kwong | 326/86 |
| 6,320,408 | B1 * | 11/2001 | Kwong | 326/31 |
| 6,771,095 | B1 * | 8/2004 | Dunlea et al. | 326/86 |
| 6,781,415 | B2 * | 8/2004 | Clark et al. | 326/81 |
| 6,822,480 | B1 * | 11/2004 | McCalmont | 326/81 |
| 6,847,230 | B2 * | 1/2005 | Mallory et al. | 326/80 |
| 6,914,470 | B2 * | 7/2005 | Watanabe et al. | 327/333 |
| 6,954,100 | B2 * | 10/2005 | Dharne et al. | 327/333 |
| 7,292,067 | B2 * | 11/2007 | Schwarz | 326/82 |

* cited by examiner

*Primary Examiner* — James H. Cho
*Assistant Examiner* — Christopher Lo
(74) *Attorney, Agent, or Firm* — William B. Kempler; Wade J. Brady, III; Frederick J. Telecky, Jr.

(57) ABSTRACT

In a method and system for translating voltage levels to interface electronic devices, a voltage translator is operable to perform the translation of voltage levels of the bi-directional signals exchanged between the electronic devices in accordance with an open-drain mode of operation and in accordance with a push-pull mode of operation. The voltage translator includes edge-rate accelerators to detect signal transitions and includes configurable resistors to provide a direct current (DC) drive current and a DC bias to hold desired voltage levels. The voltage translator is operable in the open-drain mode to detect a presence of an electronic device, and is operable in the push-pull mode upon the detection of the electronic device.

19 Claims, 3 Drawing Sheets

SEMI-BUFFERED AUTO-DIRECTION-SENSING VOLTAGE TRANSLATOR

CROSS REFERENCE TO RELATED APPLICATIONS

This application claims benefit of priority from U.S. Provisional Application No. 60/884,278 filed Jan. 10, 2007, Docket Number TI-62910 PS, entitled 'SEMI-BUFFERED AUTO-DIRECTION-SENSING VOLTAGE TRANSLATOR', which is hereby incorporated herein in its entirety.

BACKGROUND

The present disclosure relates generally to electronic circuits, and more particularly to a method and an apparatus for interfacing electronic devices having disparate operating voltages.

It is well known that electronic devices such as personal computers, televisions, digital cameras, personal entertainment devices, cellular phones, and similar others incorporate semiconductor integrated circuit (IC) chips, which are designed to operate at various voltage levels. Some IC chips such as processors may operate at lower voltages, e.g., approximately 1-2 volts, whereas some IC chips such as memory devices may operate at higher voltages, e.g., 3-5 volts. Presently, the operating voltage level for a selected IC chip may typically vary between approximately 0.8 volts to approximately 5.5 volts.

A voltage translator is an electronic circuit, which generates a voltage output signal having a desired voltage level in response to receiving a voltage input signal having a particular voltage level that is different than the desired voltage level. The voltage translator may also be referred to as a voltage converter, a voltage interface, a level shifter, and a voltage shifter. An automatic direction-sensing voltage translator enables a bi-directional exchange of digital logic signals between IC chips, circuits, or devices having disparate operating voltages.

FIG. 1A illustrates a circuit diagram of a pass-gate type voltage translator 100, according to prior art. The pass-gate type voltage translator 100 includes a port A 110 and a port B 120, each of which may be operable as an input or an output to support bi-directional signal transfer. An n-channel pass gate 130 drives high to low transition on the ports A 110 and B 120. A one-shot edge-rate accelerator 140 is operable to drive low to high transition on the ports A 110 and B 120. Pull up resistors Ra 150 and Rb 160 maintain the ports at a high level following a low to high transition. The pass-gate type voltage translator 100 provides a direct current (DC) drive to ground and therefore it is capable of supporting low-valued pull-up resistors Ra 150 and Rb 160 on the signal lines. Pass-gate type voltage translator 100 is typically used in open-drain applications at lower switching speeds on the order of 250 kHz or in push-pull applications at speeds on the order of 1 megahertz (MHz) to 10 Mhz. An open-drain application may include a wired-OR connection for a bus having multiple masters, e.g., the I2C bus. A push-pull application may include a bus having a single master at a particular instant in time.

FIG. 1B illustrates a circuit diagram of a fully-buffered type voltage translator 102, according to prior art. Transition circuits 170 and 180 are used to drive high-to-low or low-to-high transitions on the A 110 or B 120 ports when a corresponding transition is detected at either port. After the transition, buffered DC drive is applied to each port through a series resistor (Rsa 152 and Rsb 162) to hold the ports A 110 and B 120 at the current logic state until the next transition is detected. Fully-buffered type voltage translator 102 is typically used in applications requiring higher switching speeds on the order of 50 MHz to about 100 Mhz. However, the fully-buffered type voltage translator 102 is unable to operate in open-drain applications since it is unable to provide sufficient DC drive current compared to the voltage translator 100. Therefore, a need exists to provide a method and apparatus for providing voltage translation that is operable in both open-drain applications that are capable of operating at a lower switching speed and in push-pull applications that are capable of supporting higher switching speeds.

SUMMARY

Applicant recognizes that the pass-gate type voltage translator is capable of open-drain mode of operation but is not capable of supporting higher switching speeds, e.g., greater than 10 MHz. Applicant also recognizes that the fully-buffered type voltage translator is capable of supporting a higher switching speed, e.g., greater than 10 Mhz, but is not capable of supporting an open-drain application that needs a pull up resistor that is not greater than 50 kilo ohms. Applicant further recognizes that the low on-resistance of a transistor included in the pass-gate type voltage translator does not provide a transmission line having desired signal integrity. Therefore, it would be desirable to provide a voltage translator that supports both a low speed open-drain operation having lower pull up resistors and a high speed push-pull operation for exchanging bi-directional signals between electrical devices. Accordingly, it would be desirable to provide a method and system for translating disparate voltage levels, absent the disadvantages found in the prior methods discussed above.

The foregoing needs are addressed by the teachings of the present disclosure, which relates to an apparatus and method for interfacing electronic devices having disparate operating voltage levels. According to one embodiment, in a method and system for translating voltage levels to interface electronic devices, a voltage translator is operable to perform the translation of voltage levels of the bi-directional signals exchanged between the electronic devices in accordance with an open-drain mode of operation and in accordance with a push-pull mode of operation. The voltage translator includes edge-rate accelerators to detect signal transitions and includes configurable resistors to provide a direct current (DC) drive current and a DC bias to hold desired voltage levels. The voltage translator is operable in the open-drain mode to detect a presence of an electronic device, and is operable in the push-pull mode upon the detection of the electronic device.

In one aspect of the disclosure, a voltage translator that is operable in an open-drain mode of operation and a push-pull mode of operation includes a first edge-rate accelerator having a first input and a first output and a second edge-rate accelerator having a second input and a second output. The first input and the second output are coupled to form a first port and the first output and the second input are coupled to form a second port. A first pull up resistor is disposed between a first power source and the first port and a second pull up resistor is disposed between a second power source and the second port. A direct current (DC) path is provided between the first port and the second port. A path resistance of the DC path is configurable to enable the open-drain mode.

In one aspect of the disclosure, a method for interfacing a first circuit operable at a first voltage level with a second circuit operable at a second voltage level includes receiving an input signal having the first voltage level at a first port, the input signal being provided by the first circuit. An output signal which has the second voltage level is triggered at a second port and is provided to the second circuit in accordance with an open-drain mode of operation and in accordance with a push-pull mode of operation. A direct current (DC) path is enabled between the first port and the second port, thereby enabling the first port and the second port to be held at a logic low voltage level in response to one of the first port and the second port being held at the logic low voltage level, wherein the DC drive enables the first port and the second port to be held at a logic high level in response to one of the first port and the second port being held at the logic high voltage level.

Several advantages are achieved by the method and system according to the illustrative embodiments presented herein. The embodiments advantageously provide a voltage translator that is capable of supporting bi-directional signal transfers made in an open-drain mode of operation and a push-pull mode of operation. Therefore, the voltage translator advantageously supports a lower switching speed, e.g., less than 10 MHz, when operating in the open-drain mode and a higher switching speed, e.g., 50 Mhz to 100 Mhz, when operating in a push-pull mode. It is understood that as technology improves the upper and lower limits on the switch speeds may change. For example, the voltage translator advantageously interfaces a processor device with a memory device by initially operating in the open-drain mode to perform the detection of the memory device by the processor device and to operate in the push-pull mode operating at approximately 26 MHz after the detection. In the open-drain mode of operation the voltage translator advantageously includes configurable resistors to provide a direct current (DC) drive current and a DC bias to hold desired voltage levels. The configurable resistors include pull up resistors configured to have a resistance of approximately 10 kilo ohms and path resistors configured to have a value of approximately 300 to 500 ohms. The path resistors advantageously provide increased isolation between the first and second ports of the voltage translator compared to the isolation between the corresponding ports of the pass-gate type voltage translator. The voltage translator advantageously includes edge-rate accelerators that provide rapid switching of the signal at the output port corresponding to a switching of the signal at the input port. The edge-rate accelerators advantageously reduce the need for the external driver coupled to the first port of the voltage translator to drive the load coupled to the second port of the voltage translator and reduce the need for the external driver coupled to the second port of the voltage translator to drive the load coupled to the first port of the voltage translator.

DETAILED DESCRIPTION

Figure 1A:
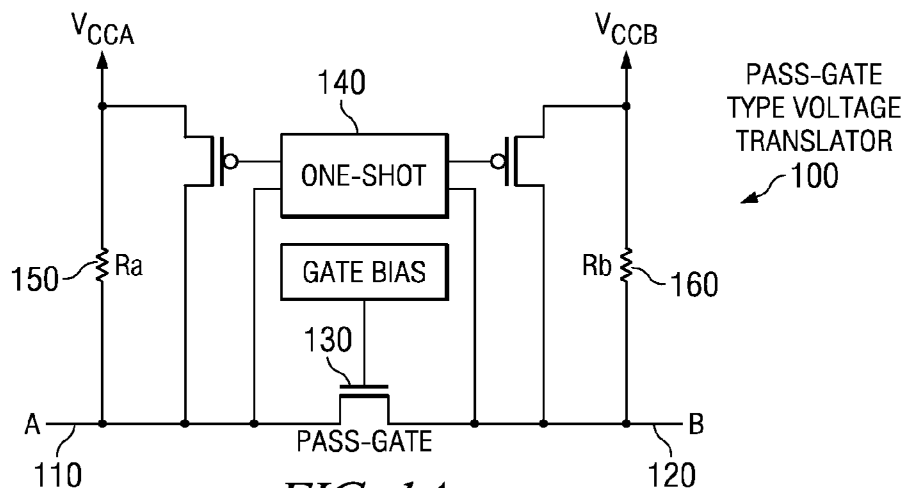
FIG. 1A illustrates a circuit diagram of a pass-gate type voltage translator, described herein above, according to prior art.
Figure 1B:
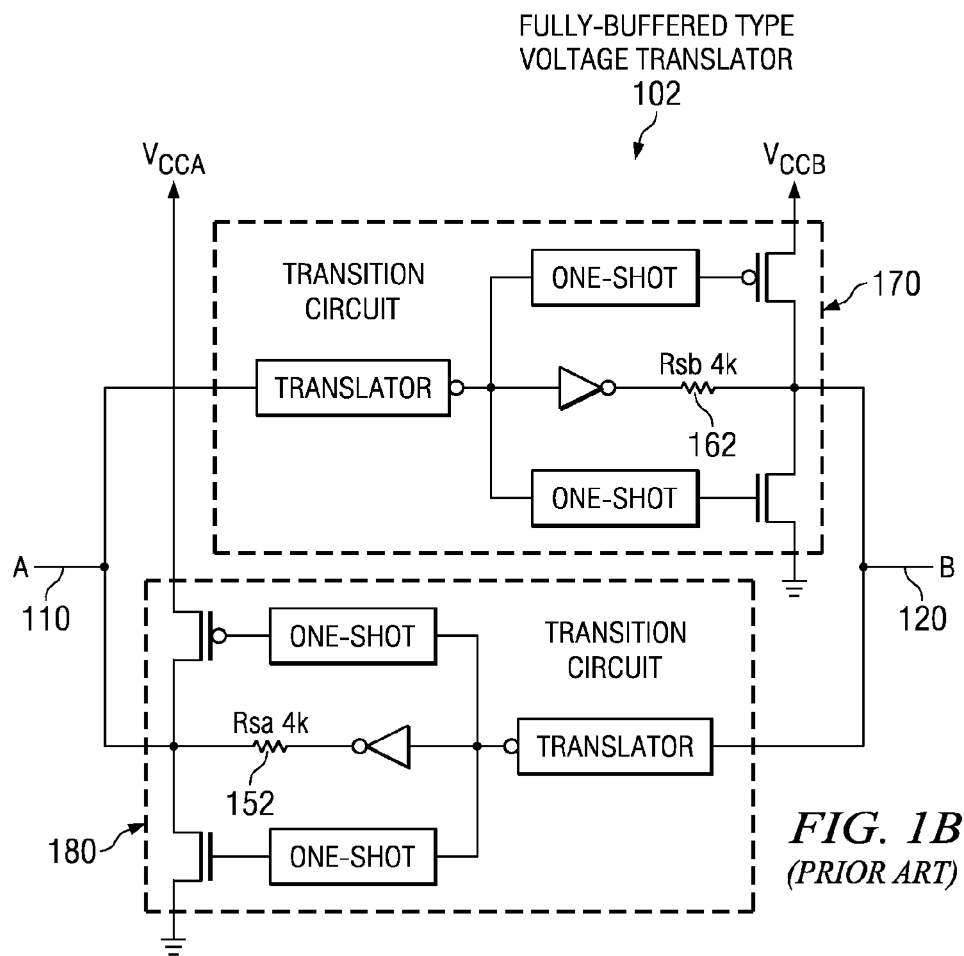
FIG. 1B illustrates a circuit diagram of a fully-buffered type voltage translator, described herein above, according to prior art.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, subassemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

The traditional pass-gate type voltage translator is capable of open-drain mode of operation but is not capable of supporting higher switching speeds, e.g., greater than 10 MHz. The traditional fully-buffered type voltage translator is capable of supporting a higher switching speed, e.g., greater than 10 Mhz, but is not capable of supporting an open-drain application that needs a pull up resistor that is not greater than 50 kilo ohms. Therefore, a need exists to provide a method and apparatus for interfacing electronic devices having disparate operating voltages. This problem may be addressed by an improved apparatus and method for providing translation of voltage levels.

According to one embodiment, in a method and apparatus for translating voltage levels to interface electronic devices, a voltage translator is operable to perform the translation of voltage levels of the bi-directional signals exchanged between the electronic devices in accordance with an open-drain mode of operation and in accordance with a push-pull mode of operation. The voltage translator includes edge-rate accelerators to detect signal transitions and includes configurable resistors to provide a direct current (DC) drive current and a DC bias to hold desired voltage levels. The voltage translator is operable in the open-drain mode to detect a presence of an electronic device, and is operable in the push-pull mode upon the detection of the electronic device.

The following terminology may be useful in understanding the present disclosure. It is to be understood that the terminology described herein is for the purpose of description and should not be regarded as limiting.

Open-drain—A type of electronic circuit connection to interface inputs and outputs. In an open-drain type mode of operation of a device or circuit, inputs or outputs of a plurality of circuits may be coupled to a single line, wire, or bus for carrying the signals. If all inputs or outputs attached to the wire are held at a high logic voltage level, a pull up resistor attached to the wire holds the wire at the high logic voltage level. If any one of the input or output of the electronic circuit is switched to a low logic voltage level, then the wire is pulled down to the low logic voltage level. The open-drain type mode of operation is used to couple multiple electronic devices having disparate operating voltage levels to a single line.

Push-pull—A type of electronic circuit connection to interface inputs and outputs. In a push-pull type mode of operation of a device or circuit, only one input or output of an electronic circuit included in a plurality of circuits may be coupled to a single line, wire, or bus for carrying the signals at a particular instant in time. Coupling more than one input or outputs to a line may cause a conflict and may result in an unpredictable operation of the wire or the bus. The push-pull type output of an electronic circuit, which typically includes a pair of complementary MOSFET devices, is primarily used in high switching speed interfacing applications.

Semiconductor Device—A semiconductor device is an electronic component that utilizes electronic properties of semiconductor materials to perform a desired function. A semiconductor device may be manufactured as a single discrete device or as one or more ICs packaged into a module.

Configuration—Describes a set up of an element, a circuit, a package, an electronic device, and similar other, and refers to a process for setting, defining, or selecting particular properties, parameters, or attributes of the device prior to its use or operation. Some configuration attributes may be selected to have a default value. For example, a pull up resistor may be configured to be equal to 10 kilo ohms to enable the voltage translator to be held at a high voltage level.

System—Interdependent electronic devices that co-operate to perform one or more predefined functions.

An improved voltage translator for interfacing electronic devices having disparate operating voltages is described with reference to FIGS. 2, 3, and 4.

Figure 2:
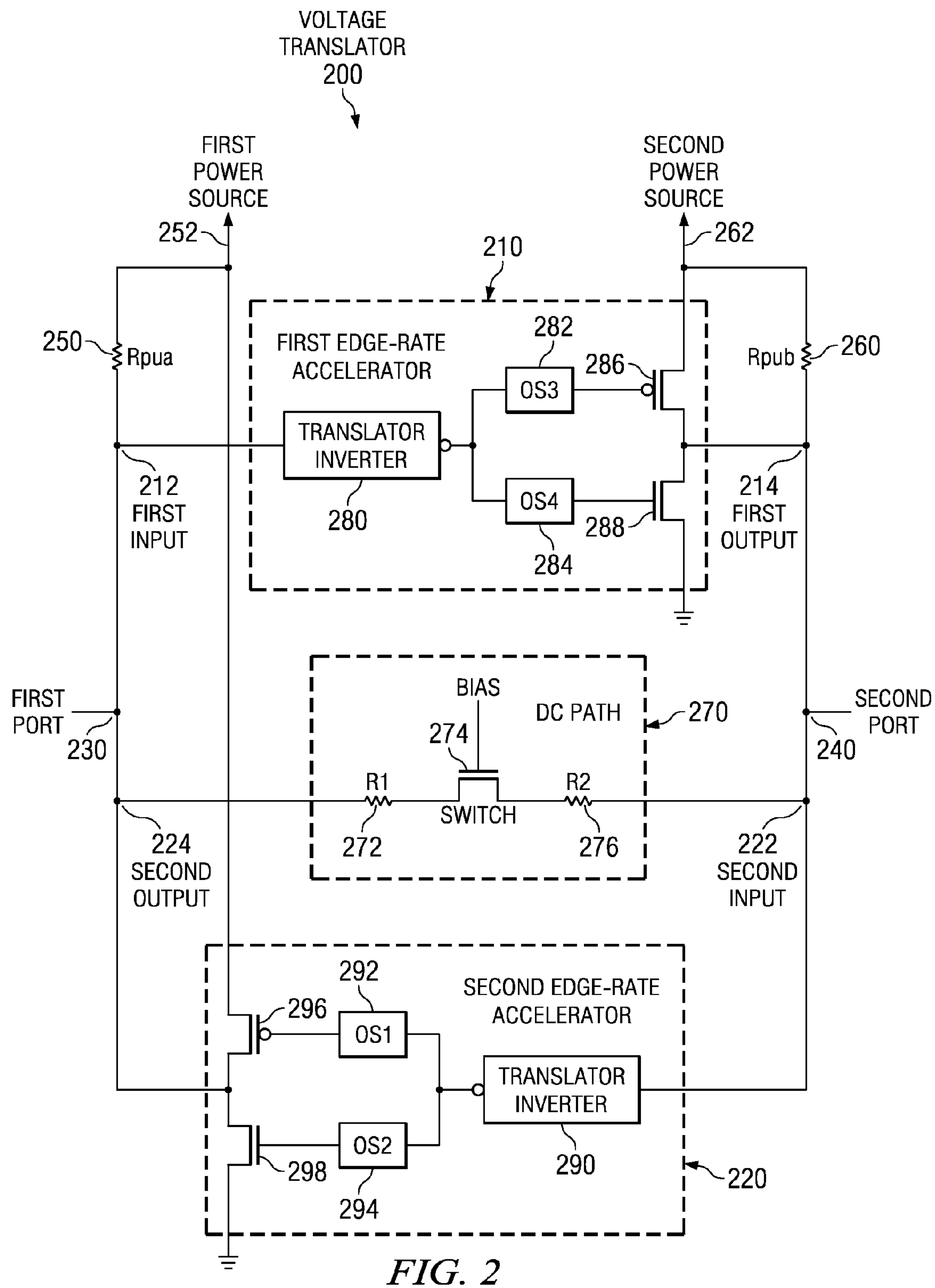
FIG. 2 illustrates a block diagram of a voltage translator, according to an embodiment.

FIG. 2 illustrates a block diagram of a voltage translator 200, according to an embodiment. The voltage translator 200 provides translation of voltage levels by interfacing input and output signals in accordance with an open-drain mode of operation and a push-pull mode of operation. In the depicted embodiment, the voltage translator 200 includes a first edge-rate accelerator 210 having a first input 212 and a first output 214 and a second edge-rate accelerator 220 having a second input 222 and a second output 224. The first edge-rate accelerator 210 is operable to rapidly force the first output 214 to a high or low voltage level corresponding to the first input 212 being switched to a high or low voltage level. Similarly, the second edge-rate accelerator 220 is operable to rapidly force the second output 224 to a high or low voltage level corresponding to the second input 222 being switched to a high or low voltage level. The first input 212 and the second output 224 are coupled to form a first port 230 and the first output 222 and the second input 214 are coupled to form a second port 240. The first and second edge-rate accelerators 210 and 220, which are triggered by both high-to-low and low-to-high edges, advantageously reduce the loading on external drivers (not shown) coupled to the voltage translator 200.

The voltage level of signals input or output at the first port 230 is different than the voltage level of the signals input or output at the second port 240. The switching frequency of input or output signals is configurable to be lower, e.g., less than 10 MHz, or higher, e.g., up to 100 MHz, depending on the application and the mode of operation. For example, a lower switching frequency of approximately 250 KHz is supported when the voltage translator 200 is operating in an open-drain mode, and a higher switching frequency of the order of less than 100 MHz is supported when the voltage translator 200 is operating in a push-pull mode of operation.

A first pull up resistor Rpua 250 is disposed between a first power source 252 and the first port 230 and a second pull up resistor Rpub 260 is disposed between a second power source 262 and the second port 240. A direct current (DC) path 270 is provided between the first port 230 and the second port 240. In a particular embodiment, the DC path 270 includes a first path resistance R1 272, a switch 274 biased by selecting one of the first power source 252 and the second power source 262 having the lower value, and second path resistance R2 276 coupled in series between the first port 230 and the second port 240. In an embodiment, the switch 274 is an n-channel complementary metal oxide semiconductor (CMOS) transistor having a finite on-resistance, e.g., less than 100 ohms. A path resistance of the DC path 270 and the pull up resistances Rpua 250 and Rpub 260 are configurable to enable the open-drain mode by providing sufficient direct current (DC) drive current and a DC bias to hold desired voltage levels at the first and second ports 230 and 240.

The DC path 270 enables the first port 230 and the second port 240 to be held at a logic low voltage level in response to one of the first port 230 and the second port 240 being held at the logic low voltage level. The first pull up resistor Rpua 250 and the second pull up resistor Rpub 260 enable the first port 230 and the second port 240 to be held at a logic high voltage level in response to one of the first port 230 and the second port 240 being at the logic high voltage level. In a particular embodiment, the path resistance is configurable to be between approximately 300 ohms to approximately 500 ohms. The configurable path resistance advantageously provides greater isolation between the first port 230 and the second port 240, thereby providing semi-buffering between the ports, compared to the pass-gate type voltage translator 100, since the path resistance of the voltage translator 200 is greater than the on-resistance of the transistor included in the pass-gate type voltage translator 100. In a particular embodiment, the first pull up resistor Rpua 250 and the second pull up resistor Rpub 260 are each configured to be less than 50 kilo ohms, e.g., 10 kilo ohms.

In the depicted embodiment, the first edge-rate accelerator 210 includes a translator inverter 280 coupled to two one-shot circuits OS3 282 and OS4 284 coupled in parallel. The translator inverter 280 shifts voltage level and provides an inversion of the signal. The one-shot circuit OS3 282 is triggered on a high to low signal transition at port 230 and OS4 284 is triggered on a high to low signal transition at port 230. OS3 282 is coupled to the gate of a p-channel CMOS transistor 286 and the OS4 284 is coupled to the gate of an n-channel CMOS transistor 288. The CMOS transistors 286 and 288 operate as a complementary or inverter pair. The drain of transistor 286 and the source of transistor 288 are coupled to each other and to the second port 240. The n-channel CMOS transistor 288 provides the switch connection to ground when the output of the OS4 284 is a logic high while the p-channel CMOS transistor 286 provides the connection to the second power source 262 when the output of the OS3 282 is a logic low.

Similarly, the second edge-rate accelerator 220 includes a translator inverter 290 coupled to two one-shot circuits OS1 292 and OS2 294 coupled in parallel. The translator inverter 290 shifts voltage level and provides an inversion of the signal. The one-shot circuit OS1 292 is triggered on a high to low signal transition at port 240 and OS2 294 is triggered on a high to low signal transition at port 240. OS1 292 is coupled to the gate of a p-channel CMOS transistor 296 and the OS2 294 is coupled to the gate of an n-channel CMOS transistor 298. The CMOS transistors 296 and 298 operate as a complementary or inverter pair. The drain of transistor 296 and the source of transistor 298 are coupled to each other and to the first port 230. The n-channel CMOS transistor 298 provides the switch connection to ground when the output of the OS2 294 is a logic high while the p-channel CMOS transistor 296 provides the connection to the first power source 252 when the output of the OS1 292 is a logic low.

Figure 3:
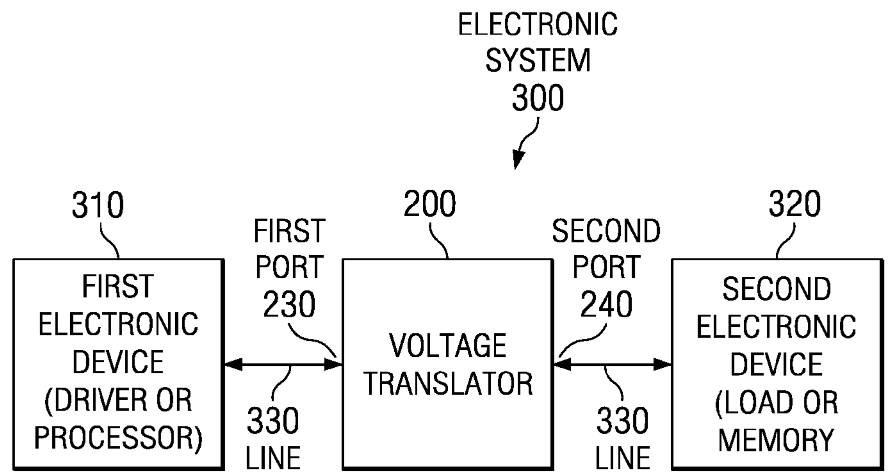
FIG. 3 illustrates a block diagram of an electronic system having a voltage translator, according to an embodiment.

FIG. 3 illustrates a block diagram of an electronic system 300 having the voltage translator 200 described with reference to FIG. 2, according to an embodiment. The electronic system 300 includes a first electronic device or circuit 310 operable at a first voltage level interfaced to a second electronic device 320 operable at a second voltage level via the first and second ports 230 and 240 of the voltage translator 200. The first electronic device 310, the voltage translator 200, and the second electronic device 320 exchange electrical signals via a conductive line, wire, or bus 330. The voltage translator 200 is operable to exchange the signals in accordance with an open-drain mode of operation and in accordance with a push-pull mode of operation.

In a particular embodiment, the first electronic device 310 is a processor, which operates at a lower voltage, e.g., 1-2 volts, and the second electronic device 320 is a memory, which operates at a higher voltage level, e.g., 3-5 volts. The electronic system 300 including the voltage translator 200 is operable in the open-drain mode having a lower switching speed, e.g., 250 KHz, to detect a presence of the memory. Upon detection of the memory by the processor, the electronic system 300 including the voltage translator 200 is operable at a higher switching speed of approximately less than 100 MHz in the push-pull mode.

Figure 4:
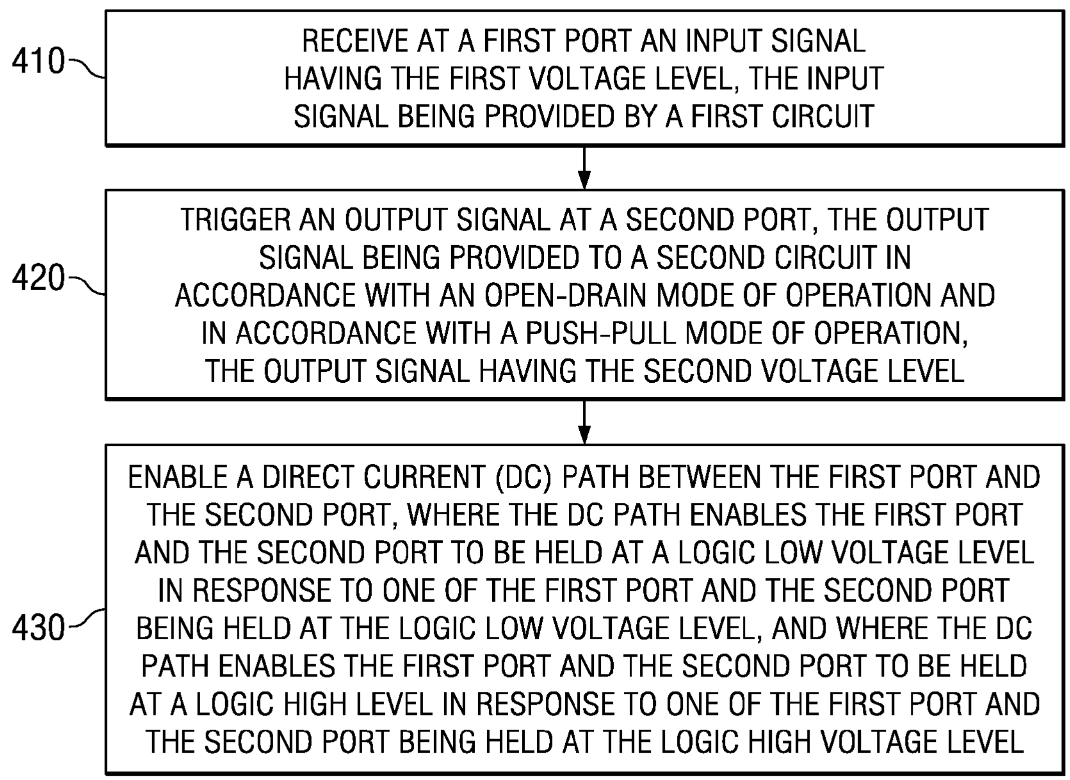
FIG. 4 is a flow chart illustrating a method for interfacing a first circuit operable at a first voltage level with a second circuit operable at a second voltage level, according to an embodiment.

FIG. 4 is a flow chart illustrating a method for interfacing a first circuit operable at a first voltage level with a second circuit operable at a second voltage level, according to an embodiment. In a particular embodiment, the method is used to interface the first device 310 with the second device 320 via the voltage translator 200 described with reference to FIG. 3. At step 410, an input signal having the first voltage level is received at a first port, the input signal being provided by the first circuit. At step 420, an output signal which has the second voltage level is triggered at a second port and is provided to the second circuit in accordance with an open-drain mode of operation and in accordance with a push-pull mode of operation. At step 430, a direct current (DC) path is enabled between the first port and the second port, thereby enabling the first port and the second port to be held at a logic low voltage level in response to one of the first port and the second port being held at the logic low voltage level, and enabling the first port and the second port to be held at a logic high level in response to one of the first port and the second port being held at the logic high voltage level.

Various steps described above may be added, omitted, combined, altered, or performed in different orders. For example, step 430 may be divided into two steps. The enablement of the DC path may include configuring a path resistance of the DC path and configuring values for the pull up resistors. As another example, the steps of receiving an input and triggering an output may be respectively performed with reference to the second port and the first port.

Several advantages are achieved by the method and system according to the illustrative embodiments presented herein. The embodiments advantageously provide a voltage translator that is capable of supporting bi-directional signal transfers made in an open-drain mode of operation and a push-pull mode of operation. Therefore, the voltage translator advantageously supports a lower switching speed, e.g., less than 10 MHz, when operating in the open-drain mode and a higher switching speed, e.g., 50 Mhz to 100 Mhz, when operating in a push-pull mode. It is understood that as technology improves the upper and lower limits on the switch speeds may change. For example, the voltage translator advantageously interfaces a processor device with a memory device by initially operating in the open-drain mode to perform the detection of the memory device by the processor device and to operate in the push-pull mode operating at approximately 26 MHz after the detection. In the open-drain mode of operation the voltage translator advantageously includes configurable resistors to provide a direct current (DC) drive current and a DC bias to hold desired voltage levels. The configurable resistors include pull up resistors configured to have a resistance of approximately 10 kilo ohms and path resistors configured to have a value of approximately 300 to 500 ohms. The path resistors advantageously provide increased isolation between the first and second ports of the voltage translator compared to the isolation between the corresponding ports of the pass-gate type voltage translator. The voltage translator advantageously includes edge-rate accelerators that provide rapid switching of the signal at the output port corresponding to a switching of the signal at the input port. The edge-rate accelerators advantageously reduce the need for the external driver coupled to the first port of the voltage translator to drive the load coupled to the second port of the voltage translator.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of using circuits, those of ordinary skill in the art will appreciate that the apparatus and methods disclosed herein are capable of being implemented as integrated circuit chips. As another example, the voltage translator may include multiple ports that are capable of communicating via multiple signal lines.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A voltage translator for open drain or push-pull applications comprising:

a first edge-rate accelerator having a first input and a first output;

a second edge-rate accelerator having a second input and a second output, wherein the first input and the second output are coupled to form a first port, wherein the first output and the second input are coupled to form a second port and wherein the first and second edge rate accelerators provide active pull-down at the first and second ports, respectively;

a first pull up resistor disposed between a first power source and the first port;

a second pull up resistor disposed between a second power source and the second port; and a direct current (DC) path between the first port and the second port, wherein a path resistance of the DC path provides a DC drive current and a DC bias to hold desired voltage levels wherein the DC path provides isolation between the ports and wherein each one of the first port and the second port support continuous communication of bi-directional digital logic signals.

2. The voltage translator of claim 1, wherein the first pull up resistor, the second pull up resistor, and the path resistance provide a DC drive current to enable an open-drain mode of operation.

3. The voltage translator of claim 1, wherein each one of the first pull up resistor and the second pull up resistor is configurable to have a resistance value that is less than 50 kilo ohms.

4. The voltage translator of claim 1, wherein the first edge-rate accelerator, the second edge-rate accelerator, the first pull up resistor, the second pull up resistor, and the DC path are operable to provide an output at one of the first and the second port, the output being provided in accordance with an open-drain mode of operation and a push-pull mode of operation.

5. The voltage translator of claim 4, wherein a switching frequency of the output provided in accordance with the open-drain mode is configurable to be approximately equal to 250 kHz.

6. The voltage translator of claim 4, wherein a switching frequency of the output provided in accordance with the push-pull mode of operation is configurable to be less than approximately 100 MHz.

7. The voltage translator of claim 1, wherein the DC path is configured to include a first series resistor, a switch, and a second series resistor coupled in series between the first port and the second port, wherein the path resistance is a sum of the first series resistor, an on-resistance of the switch, and the second series resistor.

8. The voltage translator of claim 7, wherein the switch is an n-channel CMOS transistor, wherein the n-channel CMOS transistor is biased by selecting one of the first power source and the second power source having a lower voltage.

9. The voltage translator of claim 7, wherein the path resistance is configurable to be between approximately 300 ohms to approximately 500 ohms, wherein the path resistance is configured to provide greater isolation between the first port and the second port compared to a pass-gate type voltage translator.

10. The voltage translator system of claim 1, wherein the first edge-rate accelerator and the second edge-rate accelerator isolate an external driver coupled to the first port from a load coupled to the second port.

11. The voltage translator of claim 1, wherein a change in a first voltage level of an input signal received on the first port triggers the first edge-rate accelerator to output a corresponding change in a second voltage level of an output signal on the second port.

12. The voltage translator of claim 1, wherein a change in a second voltage level of an input signal received on the second port triggers the second edge-rate accelerator to output a corresponding change in a first voltage level of an output signal on the first port.

13. The voltage translator of claim 1, wherein the DC path enables the first port and the second port to be held at a logic low voltage level in response to one of the first port and the second port being held at the logic low voltage level, wherein the first pull up resistor and the second pull up resistor enable the first port and the second port to be held at a logic high level in response to one of the first port and the second port being at the logic high voltage level.

14. A method for interfacing a first circuit operable at a first voltage level with a second circuit operable at a second voltage level, the method comprising:

receiving at a first port an input signal having the first voltage level, the input signal being provided by the first circuit;

triggering an output signal at a second port, the output signal being provided to the second circuit in accordance with an open-drain mode of operation and in accordance with a push-pull mode of operation, the output signal having the second voltage level, wherein transition of the output signal at the second port from a high logic level to a low logic level utilizes an edge-rate accelerator circuit having an active pull-down circuit; and enabling a direct current (DC) path between the first port and the second port, wherein the DC path enables the first port and the second port to be held at a logic low voltage level in response to one of the first port and the second port being held at the logic low voltage level, wherein the DC path enables the first port and the second port to be held at a logic high level in response to one of the first port and the second port being held at the logic high voltage level wherein the DC path provides isolation between the ports and wherein each one of the first port and the second port support continuous communication of bi-directional digital logic signals.

15. The method of claim 14, wherein the enabling of the DC path includes:

configuring the DC path having a path resistance, the path resistance being configurable; and configuring a first pull up resistor coupled to the first port and a second pull up resistor coupled to the second port.

16. The method of claim 14 further comprising:

receiving at the second port the input signal having the second voltage level, the input signal being provided by the second circuit;

triggering the output signal at the first port, the output signal being provided to the first circuit in accordance with an open-drain mode of operation and in accordance with a push-pull mode of operation, the output signal having the first voltage level.

17. An electronic system comprising:

a first electronic device operable at a first voltage level;

a second electronic device operable at a second voltage level; and a voltage translator electrically coupled to the first electronic device and electrically coupled to the second electronic device to perform translation of signals there between, wherein the voltage translator provides a DC path between the first and second electronic devices and is operable to exchange the signals in accordance with an open-drain mode of operation and in accordance with a push-pull mode of operation wherein the DC path provides isolation between the ports, and wherein the voltage translator comprises a first edge-rate accelerator having a first input and a first output;

a second edge-rate accelerator having a second input and a second output, wherein the first input and the second output are coupled to form a first port, wherein the first output and the second input are coupled to form a second port and wherein the first and second edge rate accelerators provide active pull-down at the first and second ports, respectively, and wherein each one of the first port and the second port support communication of bi-directional digital logic signals.

18. The electronic system of claim 17, wherein the first electronic device is a processor and the second electronic device is a memory.

19. The electronic system of claim 18, wherein the voltage translator is operable in the open-drain mode to detect a presence of the memory, wherein the voltage translator is operable in the push-pull mode in response to the memory being present.

* * * * *